United States Patent [19]
Sakai et al.

[11] Patent Number: 5,838,093
[45] Date of Patent: Nov. 17, 1998

[54] PIEZOELECTRIC ELEMENT PACKAGE IN WHICH A PIEZOELECTRIC ELEMENT ON A CHIP CARRIER IS RELIABLY SHIELDED BY USING A CAP

[75] Inventors: Yoshimi Sakai; Takumi Kooriike, both of Kawasaki, Japan

[73] Assignee: Fujitsu Limited, Kawasaki, Japan

[21] Appl. No.: 803,308

[22] Filed: Feb. 20, 1997

[30] Foreign Application Priority Data

Feb. 23, 1996 [JP] Japan ..................... 8-036838

[51] Int. Cl.$^6$ .............................. H01L 41/08; H03H 9/15
[52] U.S. Cl. .......................................... 310/348; 310/340
[58] Field of Search .................... 310/340, 348, 310/353

[56] References Cited

U.S. PATENT DOCUMENTS

| | | | |
|---|---|---|---|
| 3,931,388 | 1/1976 | Hafner et al. | 310/348 |
| 4,295,009 | 10/1981 | Weidler | 310/348 |
| 4,376,505 | 3/1983 | Wojcik | 228/215 |
| 4,376,560 | 3/1983 | Olsson et al. | 339/17 CF |
| 4,512,509 | 4/1985 | Ellis et al. | 228/180.2 |
| 4,857,988 | 8/1989 | Fottler | 357/74 |
| 5,135,402 | 8/1992 | Sweeney | 439/71 |

FOREIGN PATENT DOCUMENTS 53-23542  4/1978  Japan ..................... 310/340

*Primary Examiner*—Thomas M. Dougherty
*Attorney, Agent, or Firm*—Armstrong, Westerman, Hattori, McLeland, & Naughton

[57] ABSTRACT

A piezoelectric element package includes a chip carrier having a shielding surface and a cavity for enclosing a piezoelectric element therein, and a cap having a central axis and a shielding material on a bottom surface of the cap, the cap shielding the piezoelectric element, enclosed in the cavity of the chip carrier, with the shielding material bonded to the shielding surface of the chip carrier. The cap is in a substantially circular shape and the shielding material of the cap and the shielding surface of the chip carrier are bonded to each other such that a bonding area between the shielding material and the shielding surface is unchanged.

7 Claims, 10 Drawing Sheets

4 A

4 B

PIEZOELECTRIC ELEMENT PACKAGE IN WHICH A PIEZOELECTRIC ELEMENT ON A CHIP CARRIER IS RELIABLY SHIELDED BY USING A CAP

BACKGROUND OF THE INVENTION (1) Field of the Invention

The present invention generally relates to a piezoelectric element package, and more particularly to an improvement of a piezoelectric element package in which a piezoelectric element such as a SAW filter is shielded in a cavity of a chip carrier by using a protective cap. The present invention is suitably applied to a filter device of a high-frequency signal portion of a mobile communication system.

(2) Description of the Related Art

Recently, small-size, light-weight mobile communication systems such as automobile telephones or portable handy telephones have come into widespread use. To provide a small-size, light-weight mobile communication system with high performance, a surface acoustic wave (SAW) filter device for use in a high-frequency signal portion of the mobile communication system has been developed.

Since the SAW filter device having the SAW filter requires high reliability, a package of a ceramic material is used to protect the SAW filter or the piezoelectric element in a cavity of the package. In the SAW filter package, the SAW filter provided within the cavity of the package is shielded by using a protective cap of a metallic material.

On the other hand, it is desirable to reduce the cost of the SAW filter device so as to reduce the total cost of the mobile communication system. For this purpose, it is desirable to provide a SAW filter package which efficiently increases the productivity of the SAW filter device and reduces the number of assembly processes for producing the SAW filter device.

FIG. 1, FIG. 2A and FIG. 2B show a conventional SAW filter device. FIG. 1 is an exploded view of the conventional SAW filter device. FIG. 2A and FIG. 2B are a perspective top view and a perspective bottom view of the conventional SAW filter device.

The conventional SAW filter device shown in FIGS. 1 through 2B is used as a filter of a high-frequency signal portion of a mobile communication system such as an automobile telephone or a portable handy telephone.

As shown in FIG. 1, a SAW filter package 100 of the conventional SAW filter device in FIG. 1 generally has a chip carrier 102 and a protective cap 104. The chip carrier 102 is in a rectangular shape. The chip carrier 102 has a three-layer structure in which a first printed-circuit board 105, a second printed-circuit board 106 and a third printed-circuit board 107 are laminated together.

As shown in FIGS. 2A and 2B, the chip carrier 102 includes a plurality of input terminals 108 on an input side and a plurality of output terminals 109 on an output side.

The input terminals 108 include an input signal terminal 110, an input ground terminal 111 and an input ground terminal 112. The input signal terminal 110 is interposed between the input ground terminals 111 and 112. The output terminals 109 include an output signal terminal 113, an output ground terminal 114 and an output ground terminal 115. The output signal terminal 113 is interposed between the output ground terminals 114 and 115.

As shown in FIG. 1, the first printed-circuit board 105 is provided at the bottom of the chip carrier 102. The first printed-circuit board 105 includes a substrate 105a and a die attachment 116 on a top surface of the substrate 105a. The die attachment 116 is made of a conductive metallic material. A SAW filter 103 is attached to the die attachment 116, and the SAW filter 103 is shielded with the die attachment 116.

A ground connecting part 118 and a ground connecting part 119 are formed with the die attachment 116 on the input side of the top surface of the substrate 105a. The ground connecting parts 118 and 119 electrically connect the die attachment 116 with the input ground terminals 111 and 112. A ground connecting part 120 and a ground connecting part 121 are formed with the die attachment 116 on the output side of the top surface of the substrate 105a. The ground connecting parts 120 and 121 electrically connect the die attachment 116 with the output ground terminals 114 and 115.

As shown in FIG. 2B, the input signal terminal 110, the input ground terminals 111 and 112, the output signal terminal 113, and the output ground terminals 114 and 115 are drawn out to a bottom surface of the substrate 105a of the first printed-circuit board 105. On the bottom surface of the substrate 105a, an input signal foot pattern 110a, input ground foot patterns 111a and 112a, an output signal foot pattern 113a, and output ground foot patterns 114a and 115a are formed on the bottom surface of the substrate 105a by respective end portions of the terminals 110, 111, 112, 113, 114 and 115. These foot patterns 110a through 115a serve as external terminals of the conventional SAW filter device.

As shown in FIG. 1, the second printed-circuit board 106 is provided in the middle of the chip carrier 102. The second printed-circuit board 106 includes a substrate 106a, a plurality of pads 127 through 132 on a top surface of the substrate 106a, and a rectangular cavity 133 in the center of the substrate 106a.

The pads 127 through 132 are made of a conductive metallic material. The pads 127 through 132 are formed on the top surface of the substrate 106a as shown in FIG. 1.

These pads on the input side of the top surface of the substrate 106a include an input signal pad 127, an input ground pad 128 and an input ground pad 129 which are electrically connected with the input signal terminal 110, the input ground terminal 111 and the input ground terminal 112, respectively. The pads on the output side of the top surface of the substrate 106a include an output signal pad 130, an output ground pad 131 and an output ground pad 132 which are electrically connected with the output signal terminal 113, the output ground terminal 114 and the output ground terminal 115, respectively.

The rectangular cavity 133 is provided in the center of the substrate 106a. The pads 127 through 132 on the top surface of the substrate 106a are electrically connected with electrode portions on the SAW filter 103 by a plurality of wires (not shown). The SAW filter 103 is provided within the cavity 133 of the substrate 106a.

The second printed-circuit board 106 further includes four cap connecting patterns 140a–140d at the corners on the top surface of the substrate 106a. As shown in FIG. 1, the cap connecting patterns 140a, 140b, 140c and 140d are respectively formed integrally with the output ground pads 128, 129, 131 and 132. The cap connecting patterns 140a–140d are electrically connected with the output ground pads 128, 129, 131 and 132. The cap connecting patterns 140a–140d are drawn out to the corners of the substrate 106a. The cap connecting patterns 140a–140d at the corners of the substrate 106a are electrically connected with cap connecting wires 139a–139d at the corners of a shielding surface 137 of the third printed-circuit board 107 via the input ground terminals 111 and 112 and the output ground terminals 114 and 115.

As shown in FIG. 1, the third printed-circuit board 107 is provided at the top of the chip carrier 102. The third printed-circuit board 107 includes a substrate 107*a* and a rectangular cavity 136 in the center of the substrate 107*a*. The cavity 136 of the third printed-circuit board 107 has an area greater than an area of the cavity 133 in the second printed-circuit board 106.

In the conventional SAW filter device in FIGS. 1 through 2B, both the cavity 133 and the cavity 136 are formed in a rectangular shape. The rectangular cavity 136 in the third printed-circuit board 107 and the rectangular cavity 133 in the second printed-circuit board 106 constitute a cavity of the SAW filter package 100, the cavity enclosing the SAW filter 103 therein.

The shielding surface 137 is formed on a top surface of the substrate 107*a* of the third printed-circuit board 107. The cap 104 is bonded to the shielding surface 137. A top surface wiring layer on the shielding surface 137 is formed, and the cap 104 is electrically connected with the top surface wiring layer on the shielding surface 137. The top surface wiring layer is made of a metallic material.

Four recessed portions 138*a*, 138*b*, 138*c* and 138*d* at the corners of the substrate 107*a* are formed. The cap connecting wires 139*a*, 139*b*, 139*c* and 139*d* are provided at the recessed portions 138*a*, 138*b*, 138*c* and 138*d* of the substrate 107*a*. The cap connecting wires 139*a* through 139*d* are electrically connected with the top surface wiring layer on the shielding surface 137.

The first printed-circuit board 105, the second printed-circuit board 106 and the third printed-circuit board 107 are bonded together or laminated so that the chip carrier 102 shown in FIGS. 2A and 2B is produced.

When the chip carrier 102 is produced, the input signal terminal 110 and the input ground terminals 111 and 112 on the input side walls of the first and second printed-circuit boards 105 and 106 are electrically connected with each other. The input signal terminal 110 and the input ground terminals 111 and 112 constitute the input terminals 108 of the conventional SAW filter device. Similarly, when the chip carrier 102 is produced, the output signal terminal 113 and the output ground terminals 114 and 115 on the output side walls of the first and second printed-circuit boards 105 and 106 are electrically connected with each other. The output signal terminal 113 and the output ground terminals 114 and 115 constitute the output terminals 109 of the conventional SAW filter device.

Accordingly, when the chip carrier 102 is produced, the foot patterns 110*a* through 115*a* on the first printed-circuit board 105 are electrically connected with the pads 127 through 132 on the second printed-circuit board 106. The die attachment 116 on the first printed-circuit board 105 is electrically connected with the input ground terminals 111 and 112 and the output ground terminals 114 and 115 via the ground connecting parts 118 through 121.

In addition, the cap connecting wires 139*a* through 139*d* at the corners of the substrate 107*a* of the third printed-circuit board 107 are electrically connected with the cap connecting patterns 140*a* through 140*d* at the corners of the substrate 106*a* of the second printed-circuit board 106.

When the chip carrier 102 is produced, the SAW filter 103 is placed within the cavity 133 of the second printed-circuit board 106, and the SAW filter 103 is attached to the die attachment 116 on the first printed-circuit board 105. The electrode portions on the SAW filter 103 are electrically connected with the pads 127 through 132 on the second printed-circuit board 106 by the wires (not shown). Therefore, the SAW filter 103 is electrically connected with the input terminals 108 and the output terminals 109 of the conventional SAW filter device.

The cap 104 is bonded to the shielding surface 137 (the top surface wiring layer) on the top surface of the chip carrier 102 by soldering or the like, such that the cavity of the chip carrier 102 in which the SAW filter 103 is enclosed is fully covered with the cap 104. The cap 104 is electrically connected with the input ground terminals 111 and 112 and the output ground terminals 114 and 115.

In the above-described SAW filter package 100, the cap 104 is formed in a rectangular shape and the chip carrier 102 is formed in a rectangular shape. The central axes of the rectangular cap 104 and the rectangular chip carrier 102 are aligned. Then, the rectangular cap 104 is circumferentially positioned around the central axis of the cap 104 relative to the rectangular chip carrier 102, and the cap 104 is bonded to the shielding surface 137 on the top surface of the chip carrier 102. Therefore, it is necessary that the cap 104 be located relative to the chip carrier 102 at a correct position around the central axis of the cap 104.

If the positioning of the cap 104 to the chip carrier 102 is correctly performed, the cap 104 and the shielding surface 137 of the chip carrier 102 are correctly bonded to each other. However, it is likely that the cap 4 is rotated around the central axis of the cap 4 relative to the chip carrier 2 with a deviating angle.

FIG. 3 shows a bonded condition of the conventional SAW filter package 100 in which the cap 104 is attached to the chip carrier 102 with a deviating angle "Θ" around the central axis of the cap 104. In FIG. 3, a bonding area between the bottom surface of the cap 104 and the shielding surface 137 of the chip carrier 102 is indicated by shaded lines.

As shown in FIG. 3, the rectangular cap 104 is placed onto the shielding surface 137 of the rectangular chip carrier 102. The central axes of the cap 104 and the chip carrier 102 are aligned. Then, the cap 104 is circumferentially positioned around the central axis of the cap 104 relative to the chip carrier 102, and the bottom surface of the cap 104 and the shielding surface 137 of the chip carrier 102 are bonded to each other. A deviation of the bonding area between the bottom surface of the cap 104 and the shielding surface 137 of the chip carrier 102 is produced if the circumferential position of the cap 104 around the central axis of the cap 104 is different from the circumferential position of the chip carrier 102 by the deviating angle "Θ" as indicated in FIG. 3.

In the above-described SAW filter package 100, the rectangular cap 104 is attached to the rectangular chip carrier 102. It is likely that a deviation of the bonding area between the cap 104 and the shielding surface 137 of the chip carrier 102 will be produced when the cap 104 is bonded to the chip carrier 102. If the cap 104 is rotated around the center axis of the cap 104 relative to the chip carrier 102 by the deviating angle Θ, irregularly deviating bonding areas "A" may be produced as shown in FIG. 3. When the cap 104 is bonded to the chip carrier 102, the bonding strength of the cap 104 to the chip carrier 102 becomes unstable. It is difficult to increase the reliability of the conventional SAW filter device.

Since the circumferential position of the cap 104 of the conventional SAW filter device is likely to deviate from the correct position on the shielding surface 137 of the chip carrier 102, it is difficult to carry out a bonding process to bond the cap 104 to the chip carrier 102 at the correct position. In order to avoid the difficulty, it is necessary to use a special positioning jig or a special bonding tool during the bonding process. The number of assembly processes for the production of the conventional SAW filter device is increased, which will increase the cost of the conventional SAW filter device.

SUMMARY OF THE INVENTION

An object of the present invention is to provide an improved piezoelectric element package in which the above-described problems are eliminated.

Another object of the present invention is to provide a piezoelectric element package which remarkably reduces the cost of a piezoelectric filter device and increases the reliability of the piezoelectric filter device.

The above-mentioned objects of the present invention are achieved by a piezoelectric element package which comprises: a chip carrier having a shielding surface and a cavity for enclosing a piezoelectric element therein; and a cap having a central axis and a shielding material on a bottom surface of the cap, the cap shielding the piezoelectric element, enclosed in the cavity of the chip carrier, with the shielding material bonded to the shielding surface of the chip carrier, the cap being in a substantially circular shape and the shielding material of the cap and the shielding surface of the chip carrier being bonded to each other such that a bonding area between the shielding material and the shielding surface is unchanged.

In the piezoelectric element package of the present invention, no deviation of the bonding area between the shielding material of the cap and the shielding surface of the chip carrier is produced. Since irregularly deviating bonding areas are not produced when the cap is bonded to the chip carrier, the bonding strength of the cap to the chip carrier becomes stable, and thus the reliability of the SAW filter device can be increased. Since the cap of the present invention can be accurately positioned on the shielding surface of the chip carrier, the bonding process to bond the cap to the chip carrier can be easily performed. Since it is unnecessary to use a special positioning jig or a special bonding tool when the cap is bonded to the chip carrier, it is possible to remarkably reduce the manufacturing cost of the SAW filter device.

BRIEF DESCRIPTION OF THE DRAWINGS

The above and other objects, features and advantages of the present invention will become more apparent from the following detailed description when read in conjunction with the accompanying drawings in which.

DESCRIPTION OF THE PREFERRED EMBODIMENTS

A description will now be given of the preferred embodiments of the present invention with reference to the accompanying drawings.

Figure 4:
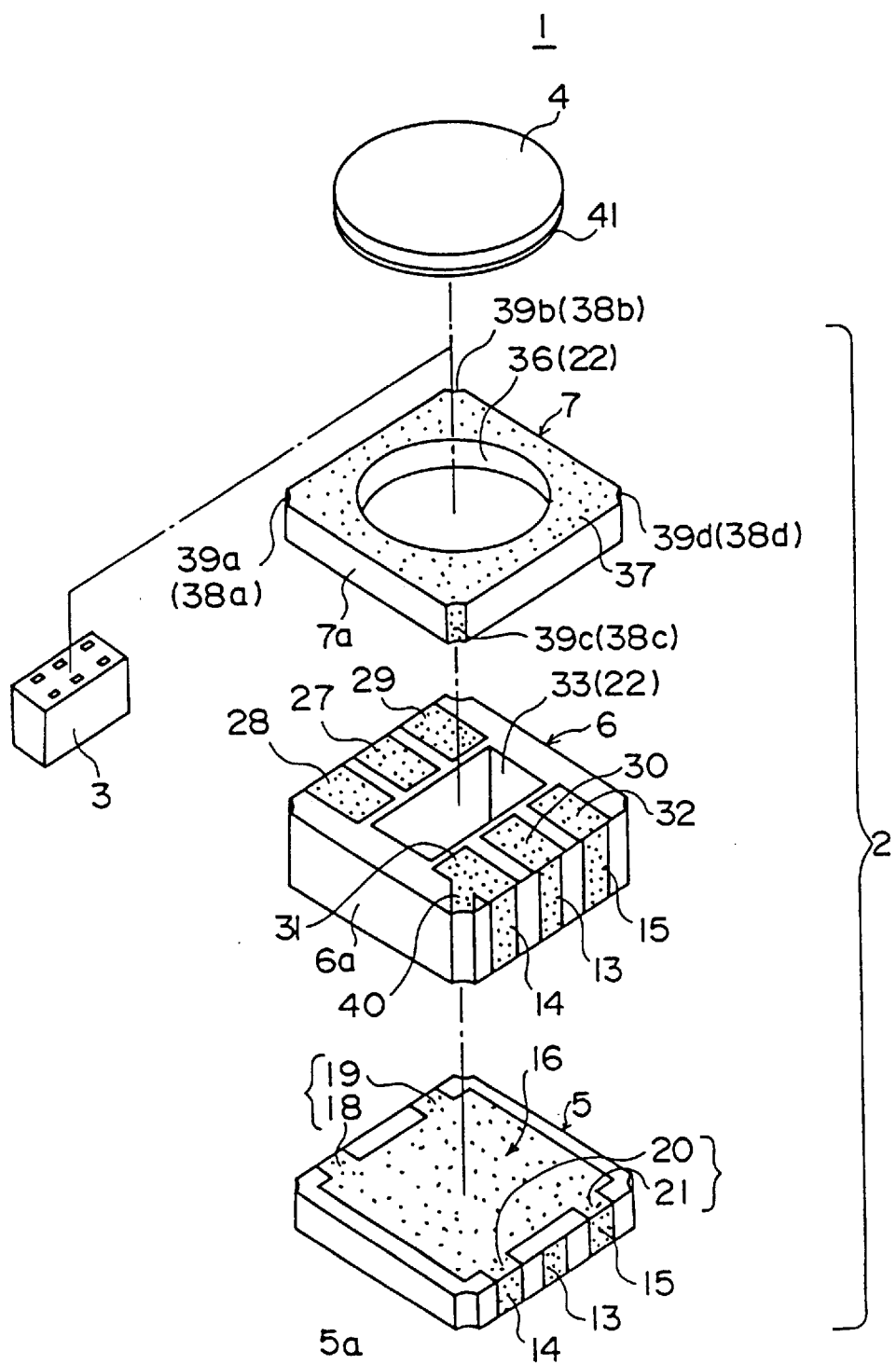
FIG. 4 is an exploded view of a SAW filter device to which one embodiment of the present invention is applied.
Figure 5B:
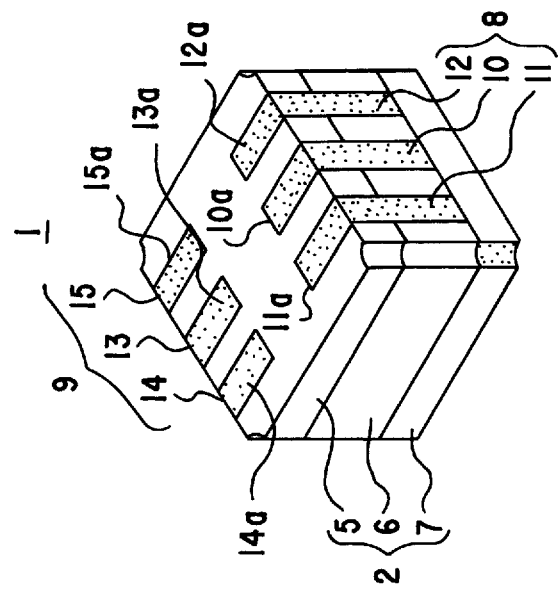
FIGS. 5A and 5B are perspective top and bottom views of the SAW filter device in FIG. 4.
Figure 5A:
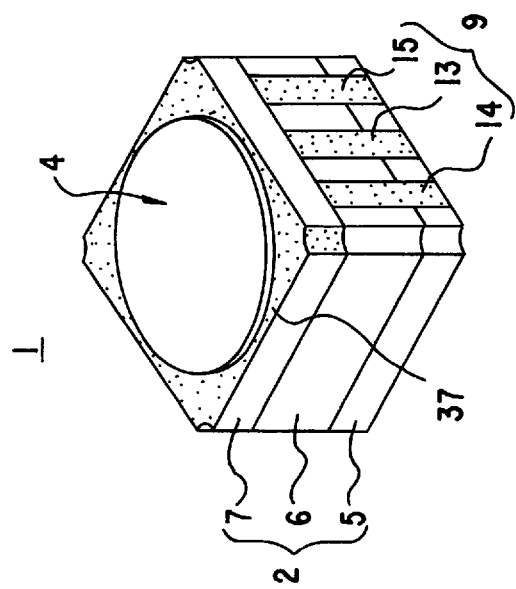
Figure 6:
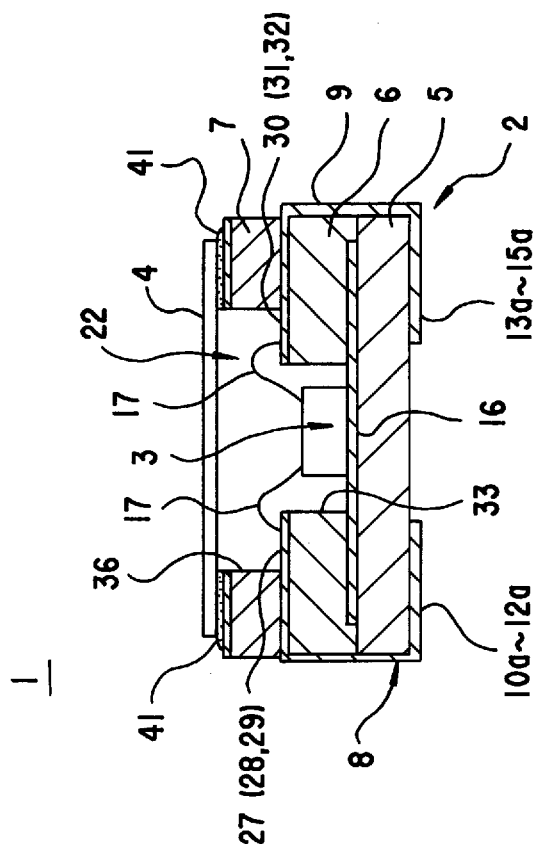
FIG. 6 is a cross-sectional view of the SAW filter device in FIG. 4.

FIG. 4 shows a surface acoustic wave (SAW) filter device to which one embodiment of the present invention is applied. FIG. 4 is an exploded view of the SAW filter device. FIG. 5A and FIG. 5B are a perspective top view and a perspective bottom view of the SAW filter device in FIG. 4, respectively. FIG. 6 is a cross-sectional view of the SAW filter device in FIG. 4.

The SAW filter device shown in FIG. 4 is used as a filter device of a high-frequency signal portion of a mobile communication system such as an automobile telephone or a portable handy telephone.

A SAW filter package 1 in one embodiment of the present invention is applied to the SAW filter device shown in FIG. 4. The SAW filter package 1 generally has a chip carrier 2 and a protective cap 4. The chip carrier 2 has a three-layer structure in which a first printed-circuit board 5, a second printed-circuit board 6 and a third printed-circuit board 7 are laminated together.

The first, second and third printed-circuit boards 5, 6 and 7 are made of, for example, an alumina ceramic material. As shown in FIGS. 5A and 5B, the chip carrier 2 includes a plurality of input terminals 8 on an input side and a plurality of output terminals 9 on an output side.

The input terminals 8 include an input signal terminal 10, an input ground terminal 11 and an input ground terminal 12. The input signal terminal 10 is interposed between the input ground terminals 11 and 12. The output terminals 9 include an output signal terminal 13, an output ground terminal 14 and an output ground terminal 15. The output signal terminal 13 is interposed between the output ground terminals 14 and 15.

As shown in FIG. 4, the first printed-circuit board 5 of the alumina ceramic material is provided at the bottom of the chip carrier 2. The first printed-circuit board 5 includes a substrate 5a and a die attachment 16 on a top surface of the substrate 5a. The die attachment 16 is made of a conductive metallic layer of, for example, a nickel/gold-plated tungsten metallized material. The die attachment 16 is formed on the top surface of the substrate 5a as shown in FIG. 4. A SAW filter 3 is attached to the die attachment 16, and the SAW filter 3 is shielded with the die attachment 16.

A ground connecting part 18 and a ground connecting part 19 are formed with the die attachment 16 on the input side of the top surface of the substrate 5a. The ground connecting parts 18 and 19 electrically connect the die attachment 16 with the input ground terminals 11 and 12. A ground connecting part 20 and a ground connecting part 21 are formed with the die attachment 16 on the output side of the top surface of the substrate 5a. The ground connecting parts 20 and 21 electrically connect the die attachment 16 with the output ground terminals 14 and 15.

As shown in FIG. 5B, the input signal terminal 10, the input ground terminals 11 and 12, the output signal terminal 13, and the output ground terminals 14 and 15 are drawn out to a bottom surface of the substrate 5a of the first printed-circuit board 5. On the bottom surface of the substrate 5a, an input signal foot pattern 10a, input ground foot patterns 11a and 12a, an output signal foot pattern 13a, and output ground foot patterns 14a and 15a are formed on the bottom surface of the substrate 5a by respective end portions of the terminals 10, 11, 12, 13, 14 and 15. These foot patterns 10a through 15a serve as external terminals of the SAW filter device.

As shown in FIG. 4, the second printed-circuit board 6 of the alumina ceramic material is provided in the middle of the chip carrier 2. The second printed-circuit board 6 includes a substrate 6a, a plurality of pads 27 through 32 on a top surface of the substrate 6a, and a rectangular cavity 33 in the center of the substrate 6a.

The pads 27 through 32 are made of a conductive metallic layer which are, for example, a nickel/gold-plated tungsten metallized material. The pads 27 through 32 are formed on the top surface of the substrate 6a as shown in FIG. 4.

These pads on the input side of the top surface of the substrate 6a include an input signal pad 27, an input ground pad 28 and an input ground pad 29 which are electrically connected with the input signal terminal 10, the input ground terminal 11 and the input ground terminal 12, respectively. The pads on the output side of the top surface of the substrate 6a include an output signal pad 30, an output ground pad 31 and an output ground pad 32 which are electrically connected with the output signal terminal 13, the output ground terminal 14 and the output ground terminal 15, respectively.

The rectangular cavity 33 is provided in the center of the substrate 6a. As shown in FIG. 6, the pads 27 through 32 on the top surface of the substrate 6a are electrically connected with electrode portions on the SAW filter 3 (which is provided within the cavity 33) by a plurality of wires 17.

The second printed-circuit board 6 further includes a cap connecting pattern 40 on the top surface of the substrate 6a. As shown in FIG. 4, the cap connecting pattern 40 is formed integrally with the output ground pad 31, and the cap connecting pattern 40 is electrically connected with the output ground pad 31. The cap connecting pattern 40 is drawn out to one corner of the substrate 6a. The cap connecting pattern 40 at the corner of the substrate 6a is electrically connected with a cap connecting wire (which will be described later) at one corner of a shielding surface (which will be described later) of the third printed-circuit board 7 via the output ground terminal 14.

As shown in FIG. 4, the third printed-circuit board 7 of the alumina ceramic material is provided at the top of the chip carrier 2. The third printed-circuit board 7 includes a substrate 7a and a circular cavity 36 in the center of the substrate 7a. The cavity 36 in the third printed-circuit board 7 has an area greater than an area of the rectangular cavity 33 in the second printed-circuit board 6.

In the present embodiment, the cavity 36 in the center of the substrate 7a is formed substantially in the shape of a circle. The circular cavity 36 in the third printed-circuit board 7 and the rectangular cavity 33 in the second printed-circuit board 6 constitute a cavity 22 of the SAW filter package 1. The cavity 22 serves to install the SAW filter 3 in the SAW filter package 1.

A shielding surface 37 is formed on a top surface of the substrate 7a of the third printed-circuit board 7. The cap 4 is bonded to the shielding surface 37. A top surface wiring layer on the shielding surface 37 is formed, and the cap 4 is electrically connected with the top surface wiring layer on the shielding surface 37. The top surface wiring layer on the shielding surface 37 is made of, for example, a nickel/gold-plated tungsten metallized material.

Four recessed portions 38a, 38b, 38c and 38d at the corners of the substrate 7a are formed. Cap connecting wires 39a, 39b, 39c and 39d are provided at the recessed portions 38a, 38b, 38c and 38d of the substrate 7a. The cap connecting wires 39a through 39d are electrically connected with the top surface wiring layer on the shielding surface 37.

The first printed-circuit board 5, the second printed-circuit board 6 and the third printed-circuit board 7 are bonded together or laminated so that the chip carrier 2 shown in FIGS. 5A and 5B is produced.

When the chip carrier 2 is produced, the input signal terminal 10 and the input ground terminals 11 and 12 on the input side walls of the first and second printed-circuit boards 5 and 6 are electrically connected with each other. The input signal terminal 10 and the input ground terminals 11 and 12 constitute the input terminals 8 of the SAW filter package 1. Similarly, when the chip carrier 2 is produced, the output signal terminal 13 and the output ground terminals 14 and 15 on the output side walls of the first and second printed-circuit boards 5 and 6 are electrically connected with each other. The output signal terminal 13 and the output ground terminals 14 and 15 constitute the output terminals 9 of the SAW filter package 1.

Accordingly, when the chip carrier 2 is produced, the foot patterns 10a through 15a on the first printed-circuit board 5 are electrically connected with the pads 27 through 32 on the second printed-circuit board 6. The die attachment 16 on the first printed-circuit board 5 is electrically connected with the input ground terminals 11 and 12 and the output ground terminals 14 and 15 via the ground connecting parts 18 through 21.

As described above, the cap connecting wires 39a through 39d are provided at the corners of the substrate 7a of the third printed-circuit board 7. The cap connecting pattern 40 of the second printed-circuit board 6, which is electrically connected with the output ground pad 31 on the top surface of the second printed-circuit board 6, is drawn out to the corner of the substrate 6a. As the second printed-circuit board 6 and the third printed-circuit board 7 are bonded together, the cap connecting wire 39c on the third printed-circuit board 7 is electrically connected with the cap connecting pattern 40 (and the output ground pad 31) on the second printed-circuit board 6. At the same time, the output ground pad 31 on the second printed-circuit board 6 is electrically connected with the top surface wiring layer on the shielding surface 37 of the third printed-circuit board 7.

When the chip carrier 2 is produced, the SAW filter 3 is provided within the cavity 22 (or the cavity 33) and attached to the die attachment 16 on the first printed-circuit board 5, as shown in FIG. 6. The electrode portions on the SAW filter 3 are electrically connected with the pads 27 through 32 on the second printed-circuit board 6 by the wires 17. Therefore, the SAW filter 3 is electrically connected with the input terminals 8 and the output terminals 9 of the SAW filter package 1.

The central axes of the cap 4 and the chip carrier 2 are aligned. The cap 4 includes a shielding material 41 on a bottom surface of the cap 4, and the shielding material 41 is bonded to the shielding surface 37 (the top surface wiring layer) on the top surface of the chip carrier 2 such that the cavity 22 of the chip carrier 2 in which the SAW filter 3 is enclosed is fully covered with the cap 4.

In the above-described embodiment, the cap 4 is in a substantially circular shape, and is circumferentially positioned around the central axis of the cap 4 relative to the chip carrier 2. The shielding material 41 of the cap 4 and the shielding surface 37 of the chip carrier 2 are bonded to each other such that a bonding area between the shielding material 41 of the cap 4 and the shielding surface 37 of the chip carrier 2 is unchanged.

The cap 4 of the present embodiment is made of a nickel/gold-plated koval steel (or 42 alloy) material. The shielding material 41 of the present embodiment is made of a gold-tin alloy or a tin-lead alloy. The shielding material 41 is bonded to the shielding surface 37 (the top surface wiring layer) on the top surface of the chip carrier 2.

When the cap 4 is attached to the chip carrier 2, the cap 4 is electrically connected with the output ground terminal 14 of the SAW filter package 1. More specifically, the electrical connection of the cap 4 and the output ground terminal 14 is made by the top surface wiring layer of the shielding surface 37, the cap connecting wire 39c, the cap connecting pattern 40, and the output ground pad 31. As the cap 4 is thus set at the ground potential, the SAW filter 3 provided within the cavity 22 is electrically shielded by the cap 4.

The SAW filter package 1 of the above-described embodiment comprises the cap 4 in a substantially circular shape and the cavity 36 (or the cavity 22) in a substantially circular shape. As described above, the shielding material 41 and the shielding surface 37 are bonded to each other such that a bonding area between the shielding material 41 and the shielding surface 37 is unchanged. Thus, no deviation of the bonding area between the shielding material 41 of the cap 4 the shielding surface 37 of the chip carrier 2 is produced when the cap 4 is bonded to the chip carrier 2.

Figure 7:
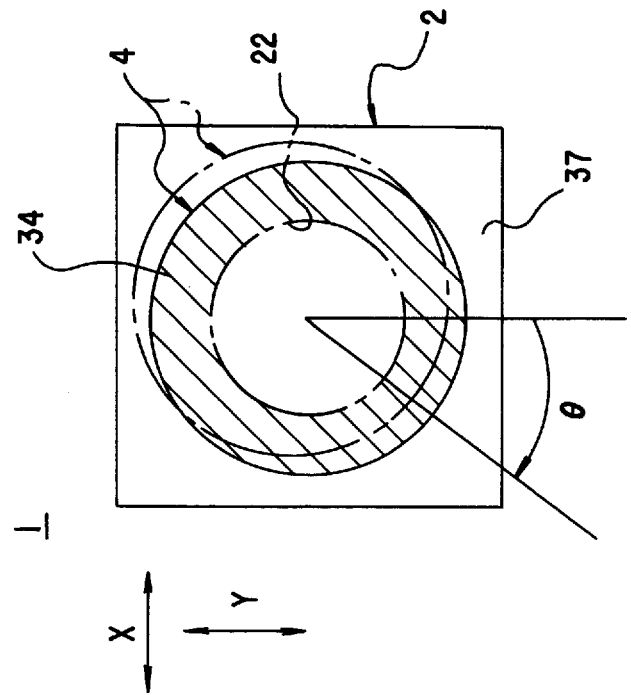
FIG. 7 is a top view of the SAW filter device for explaining a bonding condition of the SAW filter device in which a cap is attached to a chip carrier.

FIG. 7 shows a bonding condition of the SAW filter device in FIG. 4, in which the cap 4 is attached to the chip carrier 2. In FIG. 7, a bonding area 34 between the shielding material 41 and the shielding surface 37 is indicated by shaded lines.

As shown in FIG. 7, the cap 4 is placed onto the shielding surface 37 of the chip carrier 2. The central axes of the cap 4 and the chip carrier 2 are aligned. The cap 4 is circumferentially positioned around the central axis of the cap 4 relative to the chip carrier 2, and the shielding material 41 and the shielding surface 37 are bonded to each other. The bonding area 34 between the shielding material 41 and the shielding surface 37 is unchanged if the cap 4 is rotated around the central axis of the cap 4 relative to the chip carrier 2.

In the above-described embodiment, if the circumferential position of the cap 4 around the center axis of the cap 4 differs from the circumferential position of the chip carrier 2 by a deviating angle Θ, as indicated in FIG. 7, no deviation of the bonding area 34 between the shielding material 41 and the shielding surface 37 is produced.

Figure 3:
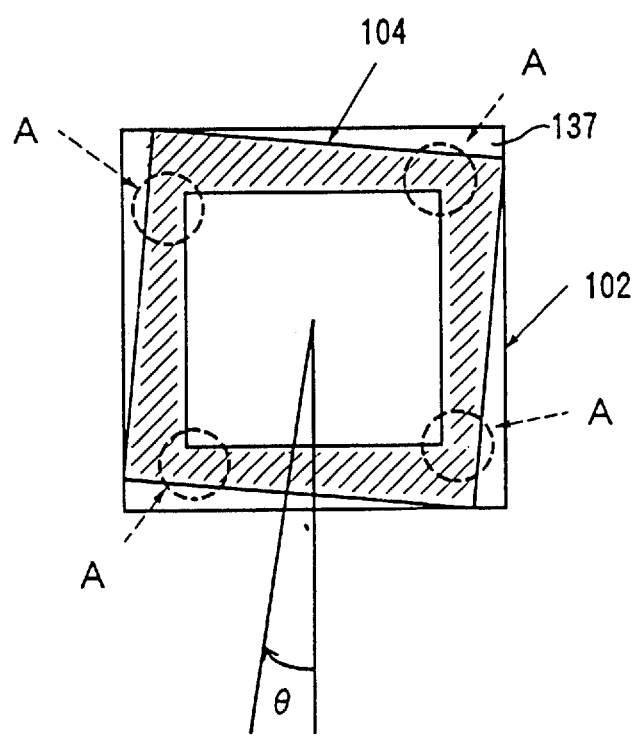
FIG. 3 is a top view of the conventional SAW filter device for explaining a bonded condition of the conventional SAW filter device in which a cap is attached to a chip carrier with a deviation.

This feature of the above-described embodiment is different from the case of the conventional SAW filter device shown in FIG. 3. The bonding area 34 between the shielding material 41 and the shielding surface 37 after the cap 4 is bonded to the chip carrier 2 remains unchanged. Since irregularly deviating bonding areas are not produced when the cap 4 is bonded to the chip carrier 2, the bonding strength of the cap 4 to the chip carrier 2 becomes stable, and thus the reliability of the SAW filter device can be increased.

When the cap 4 of the above-described embodiment is correctly positioned on the shielding surface 37 of the chip carrier 2, it is possible to easily carry out a bonding process to bond the cap 4 to the chip carrier 2. Since it is unnecessary to use a special positioning jig or a special bonding tool when the cap 4 is bonded to the chip carrier 2, it is possible to remarkably reduce the manufacturing cost of the SAW filter device.

In the above-described embodiment, before the cap 4 is bonded to the chip carrier 2, the shielding material 41 is attached to the bottom surface of the cap 4. In order to bond the shielding material 41 to the bottom surface of the cap 4, the shielding material 41 is heated so that the shielding material 41 is fused.

Figure 1:
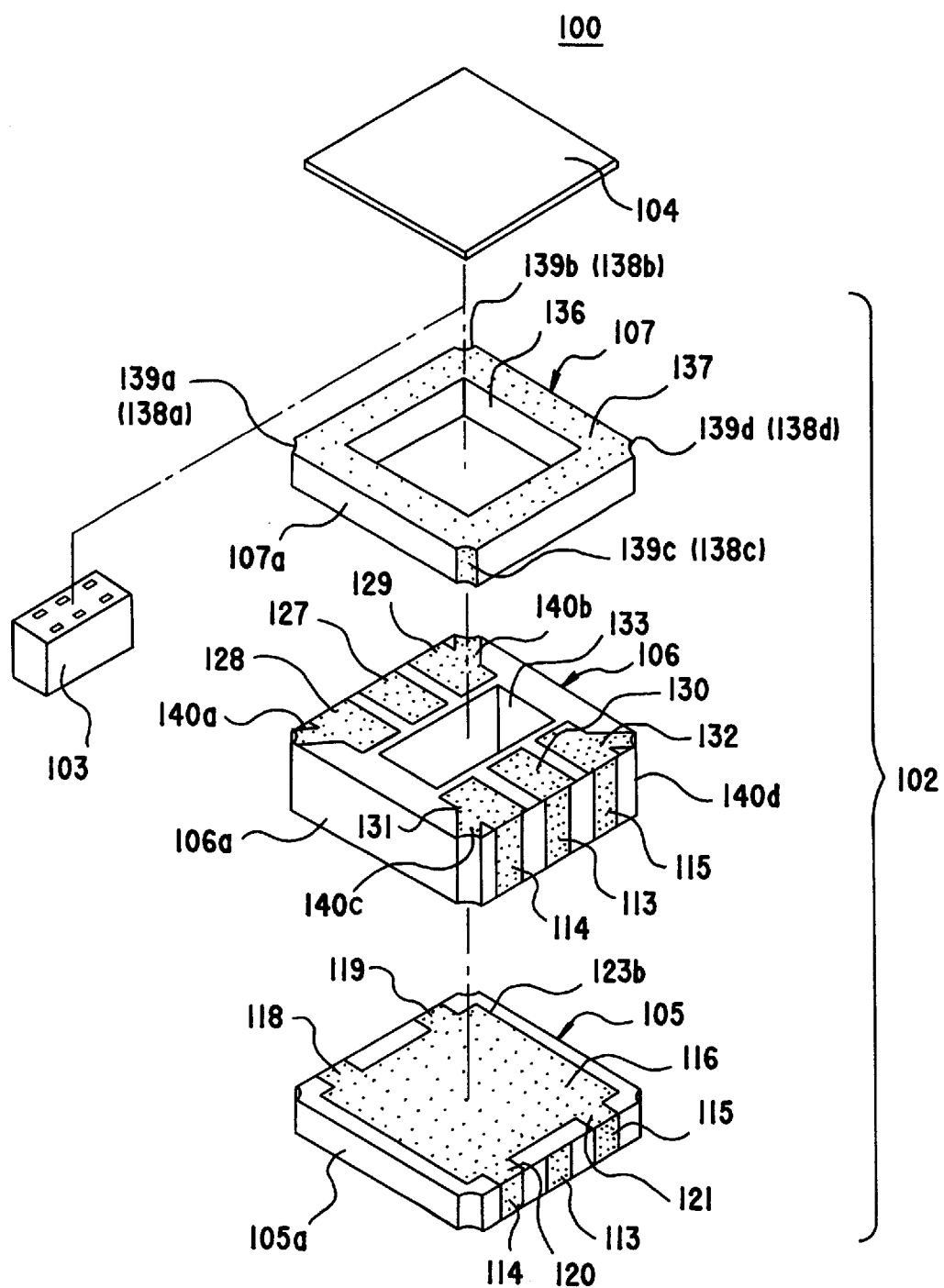
FIG. 1 is an exploded view of a conventional surface acoustic wave (SAW) filter device.
Figure 2B:
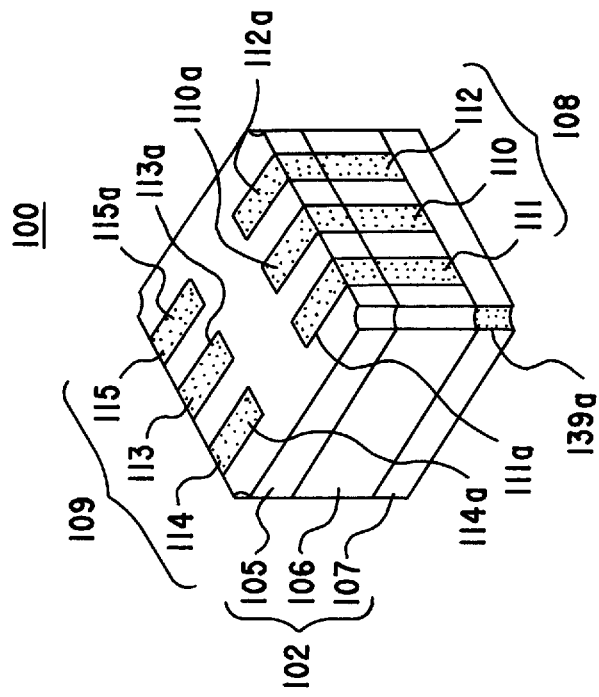
FIGS. 2A and 2B are perspective top and bottom views of the conventional SAW filter device in FIG. 1.
Figure 2A:
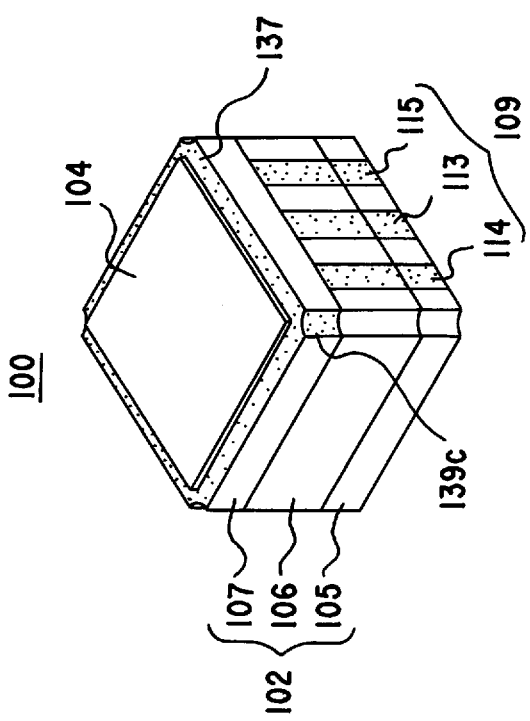
Figure 8A:
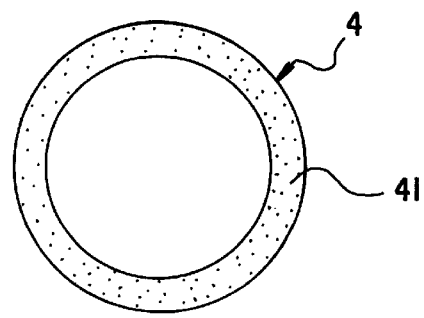
FIGS. 8A and 8B are diagrams showing a shielding material of the cap of the SAW filter device in FIG. 4 and a shielding material of the cap of the conventional SAW filter device in FIG. 1.
Figure 8B:
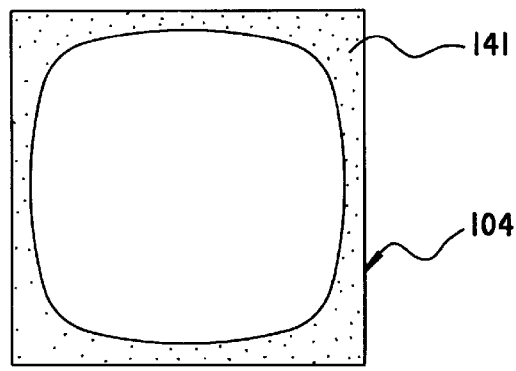

FIG. 8A shows the shielding material 41 of the cap 4 of the SAW filter device in FIG. 4, and FIG. 8B shows the shielding material 141 of the cap 104 of the conventional SAW filter device in FIG. 1.

As shown in FIG. 8B, in the case of the conventional SAW filter device, the shielding material 141 is heated so that the shielding material 141 is fused in order to bond the shielding material 141 to the cap 104. Generally, when the shielding material 141 is fused, a surface tension on the shielding material 141 is produced. Since the cap 104 has the rectangular shape, the surface tension at the corners of the shielding material 141 corresponding to the corners of the rectangular cap 104 becomes relatively large, and the irregularly deviating bonding areas of the shielding material 141 are produced as shown in FIG. 3.

Therefore, when the cap 104 is bonded to the chip carrier 102, the irregularly deviating bonding areas at the corners of the cap 104 may be produced. Since a certain portion of the shielding material 141, other than the corners of the shielding material 141, may leak, the reliability of the conventional SAW filter device may become poor.

As shown in FIG. 8A, in the case of the above-described embodiment, the cap 4 is in the shape of a circle, and the surface tension on the entire shielding material 41, produced when the shielding material 41 is fused by heating, becomes uniform. No irregularly deviating bonding area of the shielding material 41 is produced when the cap 4 is bonded to the chip carrier 2. Therefore, the bonding strength of the cap 4 to the chip carrier 2 becomes stable, and the reliability of the SAW filter device can be increased.

Figure 9:
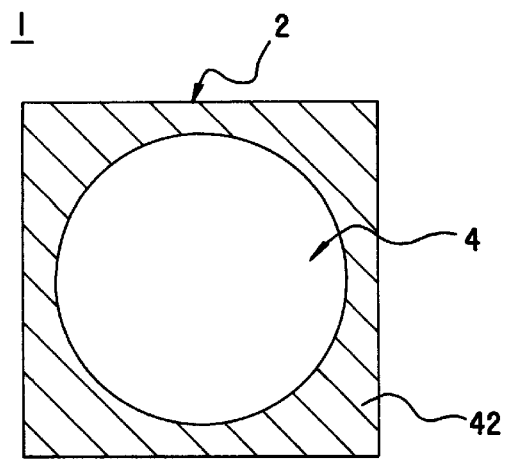
FIG. 9 is a diagram showing a non-bonded area of a shielding surface on the chip carrier to which the cap is bonded.

FIG. 9 shows a non-bonded area 42 of the shielding surface 37 on the top of the chip carrier 2 to which the cap 4 is bonded. In FIG. 9, the non-bonded area 42 is indicated by shaded lines.

In the above-described embodiment, the chip carrier 2 is in a rectangular shape and the cap 4 is in the shape of a circle. The non-bonded area 42 of the shielding surface 37 on the top of the chip carrier 2 is formed after the cap 4 is bonded to the chip carrier 2. When the shielding material 41 on the cap 4 is bonded to the shielding surface 37 on the chip carrier 2, a certain amount of the shielding material 41 unused for the bonding of the cap 4 enters the non-bonded area 42 when the shielding material 41 is fused by heating. The non-bonded area 42 serves to hold the non-bonded shielding material 41 being left on the top of the chip carrier 2 after the cap 4 is bonded to the chip carrier 2.

Accordingly, in the above-described embodiment, the non-bonded area 42 of the shielding surface 37 is formed after the cap 4 is bonded to the chip carrier 2, and the non-bonded area 42 holds the non-bonded shielding material 41 being left on the top of the chip carrier 2. It is unnecessary to provide a recessed portion on the side of the chip carrier 2 for holding the non-bonded shielding material 41 as in the conventional SAW filter device. Thus, the above-described embodiment can prevent the short circuit of the terminals 10 through 15 on the side of the chip carrier 2, and it can increase the reliability of the SAW filter device.

Figure 10:
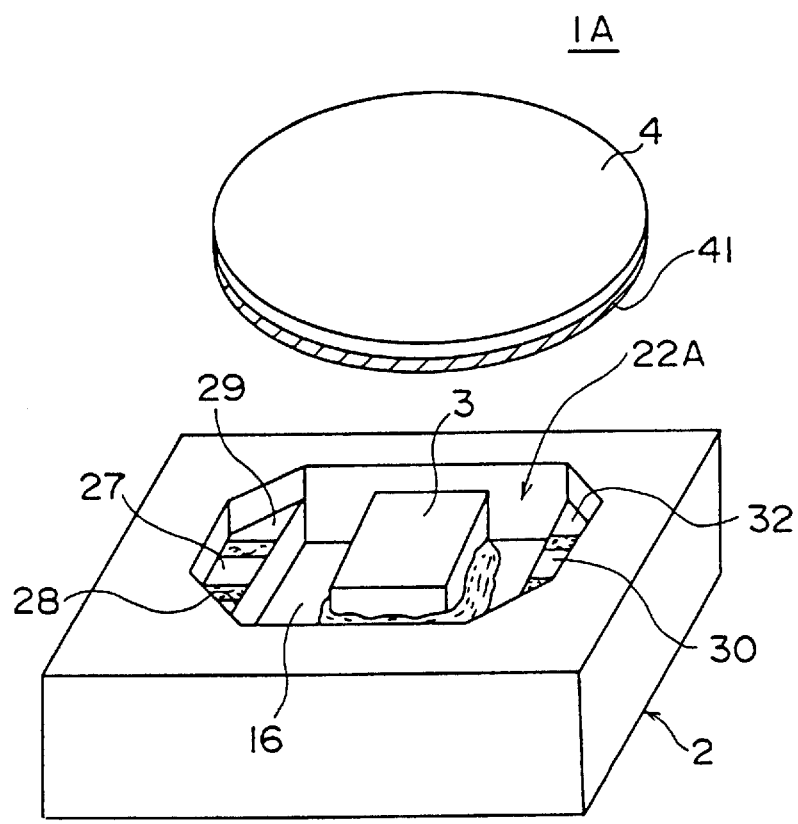
FIG. 10 is a perspective view of a SAW filter device to which another embodiment of the present invention is applied.
Figure 11:
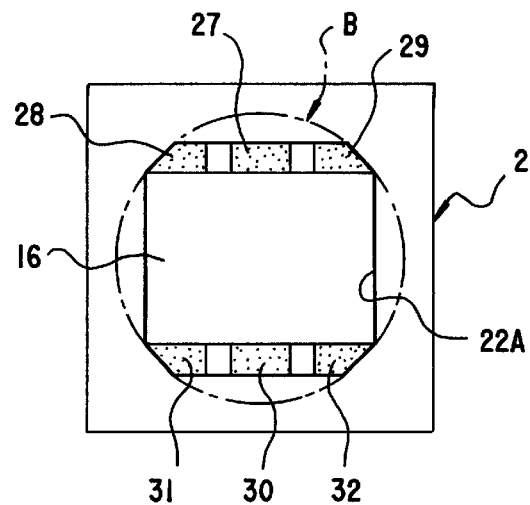
FIG. 11 is a top view of the SAW filter device in FIG. 10.

FIG. 10 shows a SAW filter device to which another embodiment of the present invention is applied. FIG. 11 is a top view of the SAW filter device in FIG. 10 in which the cap 4 is removed from the SAW filter device.

In FIGS. 10 and 11, the elements which are the same as corresponding elements in FIGS. 4 through 6 are designated by the same reference numerals, and a description thereof will be omitted. In the SAW filter device in FIG. 10, the cap 4 is removed from the SAW filter device.

In the previous embodiment in FIGS. 4 through 6, the cavity 36 (or the cavity 22) is formed in a circular shape corresponding to the circular shape of the cap 4.

Referring to FIGS. 10 and 11, a SAW filter package 1A of the present embodiment comprises the chip carrier 2 including a cavity 22A which is formed in the shape of a polygon circumscribed by a circle, the polygon having not less than five sides. In particular, the cavity 22A in FIGS. 10 and 11 is in the shape of an octagon circumscribed by a circle as indicated by a bold line in FIG. 11.

As described previously, in order to increase the reliability of the SAW filter device, it is desirable that the bonding area 34 between the shielding material 41 and the shielding surface 37 be unchanged. Therefore, the circular cavity 36 (or the cavity 22) and the circular cap 4 in the previous embodiment in FIGS. 4 through 6 are most suitable for an increased reliability of the SAW filter device.

Similarly, the cavity 22A in the polygonal shape and the circular cap 4 in the present embodiment are also suitable in order to increase the reliability of the SAW filter device. In the present embodiment, the bonding area between the shielding material 41 and the shielding surface 37 is substantially unchanged.

In order to allow the bonding area between the shielding material 41 and the shielding surface 37 to be unchanged, it is necessary that, in the embodiment in FIGS. 10 and 11, the cavity 22A of the chip carrier 2 be in the shape of a polygon circumscribed by a circle. In FIG. 11, the octagonal shape of the cavity 22A is indicated by the bold line, and the circumscribing circle is indicated by an arrow "B" (a one-dot chain line in FIG. 11).

In the above-described embodiment, the cap 4 is in the shape of a circle, and the cavity 22A of the chip carrier 2 is in the shape of a polygon circumscribed by a circle. Accordingly, the shielding material 41 of the cap 4 and the shielding surface 37 of the chip carrier 2 are bonded to each other such that the bonding area between the shielding material 41 and the shielding surface 37 is substantially unchanged if the cap 4 is rotated around the central axis of the cap 4 relative to the chip carrier 2. No irregularly deviating bonding area of the shielding material 41 is produced when the cap 4 is bonded to the chip carrier 2. Therefore, the bonding strength of the cap 4 to the chip carrier 2 becomes stable, and the reliability of the SAW filter device can be increased.

It should be noted that the shape of the cavity of the chip carrier 2 according to the present invention is not limited to the octagonal shape of the above-described embodiment. A modification may be made according to the present invention.

Figure 12:
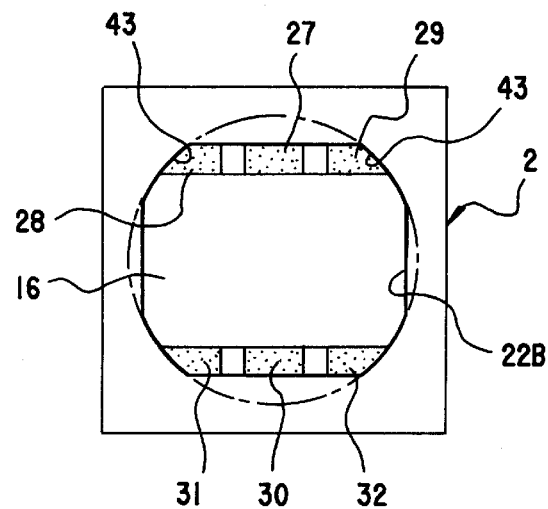
FIG. 12 is a diagram showing a modification of a cavity of the chip carrier of the SAW filter device in FIG. 10.

For example, FIG. 12 shows a modification of the cavity of the chip carrier 2 of the SAW filter device in FIG. 10. In the SAW filter device in FIG. 12, the cap 4 is removed from the SAW filter device. In FIG. 12, the elements which are the same as corresponding elements in FIGS. 4 through 6 are designated by the same reference numerals, and a description thereof will be omitted.

Referring to FIG. 12, a SAW filter package of the present embodiment comprises the chip carrier 2 including a cavity 22B which is formed in a generally circular shape as indicated by a bold line in FIG. 12. In particular, the generally circular shape of the cavity 22B in FIG. 12 includes four arc portions 43 and four straight portions. The arc portions 43 are circumscribed by a circle indicated by a one-dot chain line in FIG. 12, the center of the circle located at the central axis of the chip carrier 2.

In the present embodiment, the cap 4 is in the shape of a circle, and the cavity 22B of the chip carrier 2 is in the generally circular shape. Similarly to the embodiment of FIGS. 10 and 11, in the present embodiment, the shielding material 41 of the cap 4 and the shielding surface 37 of the chip carrier 2 are bonded to each other such that the bonding area between the shielding material 41 and the shielding surface 37 is substantially unchanged. No irregularly deviating bonding area of the shielding material 41 is produced when the cap 4 is bonded to the chip carrier 2. Therefore, the bonding strength of the cap 4 to the chip carrier 2 becomes stable, and the reliability of the SAW filter device can be increased.

Figure 13:
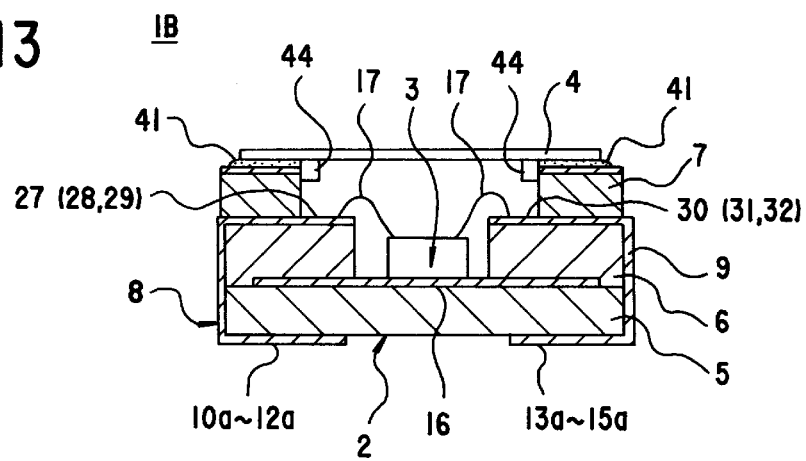
FIG. 13 is a cross-sectional view of a SAW filter device to which a further embodiment of the present invention is applied.

FIG. 13 shows a SAW filter device to which a further embodiment of the present invention is applied. In FIG. 13, the elements which are the same as corresponding elements in FIG. 6 are designated by the same reference numerals, and a description thereof will be omitted.

In the previous embodiment in FIGS. 4 through 6, the cap 4 is circumferentially positioned around the central axis of the cap 4 relative to the chip carrier 2. Even if the circumferential position of the cap 4 around the center axis of the cap 4 differs from the circumferential position of the chip carrier 2 by the deviating angle Θ, as indicated in FIG. 7, no deviation of the bonding area 34 between the shielding material 41 and the shielding surface 37 is produced. However, when the cap 4 is positioned relative to the chip carrier 2, the cap 4 may deviate from the correct position in two mutually-perpendicular horizontal directions which are indicated by the arrows "X" and "Y" in FIG. 7. That is, the central axes of the cap 4 and the chip carrier 2 are not aligned. A deviating position of the cap 4 in such a case is indicated by a one-dot chain line in FIG. 7.

If the cap 4 deviates from the correct position with respect to the horizontal directions X and Y, the reliability of the SAW filter device may be lowered. The embodiment of FIG. 13 is provided to avoid the above-mentioned problem of the previous embodiment of FIGS. 4 through 6.

Referring to FIG. 13, a SAW filter package 1B of the present embodiment comprises the cap 4 including a cap positioning unit 44 which positions the cap 4 on the chip carrier 2 with respect to the horizontal directions X and Y. The cap positioning unit 44 aligns the central axis of the cap 4 with the central axis of the chip carrier 2. Therefore, the cap positioning unit 44 prevents the cap 4 from deviating from the correct position on the chip carrier 2 in the horizontal directions X and Y when the cap 4 is positioned relative to the chip carrier 2.

As shown in FIG. 13, the cap positioning unit 44 of the present embodiment comprises a plurality of projections on the bottom surface of the cap 4, and the projections are formed so that they are smoothly fitted to an inside peripheral surface of the cavity 22 (or the cavity 36) of the chip carrier 2.

The cap positioning unit 44 of the present embodiment may be produced by press forming of the cap 4. Alternatively, the cap positioning unit 44 may be produced by bonding a metallic part such as a pin to the bottom surface of the cap 4 by welding or soldering.

In the above-described embodiment, the cap positioning unit 44 positions the cap 4 on the chip carrier 2 with respect to the horizontal directions X and Y. The cap positioning unit 44 prevents the cap 4 from deviating from the correct position on the chip carrier 2 in the horizontal directions X and Y when the cap 4 is positioned relative to the chip carrier 2. In addition, in the above-described embodiment, if the cap 4 is rotated around the central axis of the cap 4 relative to the chip carrier 2, the deviation of the bonding area between the shielding material 41 and the shielding surface 37 is prevented.

Accordingly, in the above-described embodiment, the cap 4 can be correctly positioned relative to the chip carrier 2 with respect to the horizontal directions X and Y, the bonding strength of the cap 4 to the chip carrier 2 is made more stable, and the reliability of the SAW filter device can be further increased.

Further, in the above-described embodiment, the cap positioning unit 44 is a plurality of projections on the bottom surface of the cap 4, and the projections are formed so that they are smoothly fitted to the inside peripheral surface of the cavity 22 of the chip carrier 2. Since the structure of the cap positioning unit 44 is simple and can be easily provided, it is possible for the piezoelectric element package of the present embodiment to efficiently increase the reliability of the SAW filter device by correctly positioning the cap 4 on the chip carrier 2.

In the foregoing description of the preferred embodiments, the cap 4 is formed in a circular shape. However, the cap 4 of the piezoelectric element package according to the present invention is not necessarily formed in the shape of a true circle. It is readily understood that a protective cap in a substantially circular shape sufficiently meets the requirement of the piezoelectric element package of the present invention to eliminate the directional deviation of the bonding area when the cap is bonded to the chip carrier.

Figure 14A:
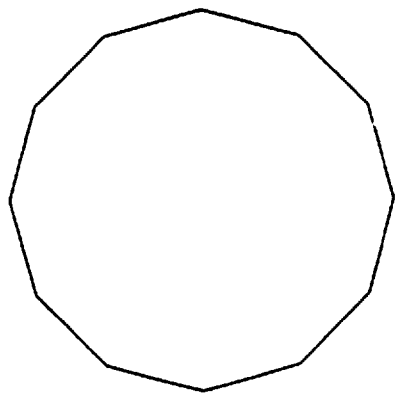
FIG. 14A and FIG. 14B are diagrams showing variations of the cap of the SAW filter device in FIG. 4.
Figure 14B:
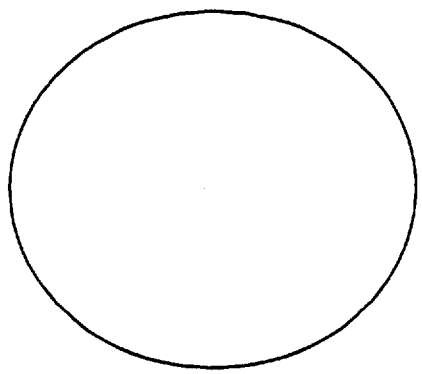

For example, FIG. 14A and FIG. 14B show variations of the cap of the SAW filter device in FIG. 13. A cap 4A in the embodiment of FIG. 14A is formed in the shape of a regular polygon circumscribed by a circle. A cap 4B in the embodiment of FIG. 14B is formed in the shape of an ellipse having the larger diameter nearly equal to the smaller diameter. The cap 4, the cap 4A and the cap 4B can be suitably applied to the piezoelectric element package of the present invention. These caps are formed in a substantially circular shape, and it is readily understood that they sufficiently meet the requirement for the present invention to eliminate the directional deviation of the bonding area when the cap is bonded to the chip carrier.

In the forgoing description of the preferred embodiments, the piezoelectric element package of the present invention is applied to a SAW filter device. However, the present invention is not limited to the above embodiments. It is readily understood that the present invention is also applicable to a different device, such as a semiconductor device in which a semiconductor element is shielded in a cavity of a chip carrier of a ceramic material by using a protective cap.

What is claimed is:

1. A piezoelectric element package comprising:
   a chip carrier having a shielding surface and a cavity for enclosing a piezoelectric element therein; and
   a cap having a central axis and a shielding material on a bottom surface of the cap, said cap shielding the piezoelectric element, enclosed in the cavity of the chip carrier, with said shielding material bonded to the shielding surface of the chip carrier,
   said cap being in a substantially circular shape and the shielding material of the cap and the shielding surface of the chip carrier being bonded to each other such that a bonding area between the shielding material and the shielding surface is unchanged upon an angular deviation of said cap relative to said central axis, and
   wherein at least the shielding surface of the chip carrier is in a non-circular shape, the shielding surface includes a non-bonded area not covered with the cap, the non-bonded area holding an amount of the shielding material not used to bond the cap to the chip carrier.

2. The piezoelectric element package according to claim 1, wherein at least the cavity of the chip carrier on the shielding surface is in a circular shape.

3. The piezoelectric element package according to claim 1, wherein at least the cavity of the chip carrier on the shielding surface is formed in a generally circular shape, the generally circular shape including a plurality of arc portions therein.

4. The piezoelectric element package according to claim 1, wherein at least the cavity of the chip carrier on the shielding surface is formed in the shape of a polygon circumscribed by a circle, the polygon having not less than five sides.

5. The piezoelectric element package according to claim 1, further comprising:
   cap positioning means for positioning the cap relative to the chip carrier with respect to mutually-perpendicular horizontal directions.

6. The piezoelectric element package according to claim 5, wherein said cap positioning means comprises a plurality of projections on the bottom surface of the cap, said projections being formed so that the projections are fitted to an inside peripheral surface of the cavity of the chip carrier.

7. The piezoelectric element package according to claim 1, wherein the piezoelectric element is a surface acoustic wave filter.

* * * * *